United States Patent
Hur et al.

(10) Patent No.: US 7,768,842 B2
(45) Date of Patent: Aug. 3, 2010

(54) SEMICONDUCTOR MEMORY DEVICE VOLTAGE GENERATING CIRCUIT FOR AVOIDING LEAKAGE CURRENTS OF PARASITIC DIODES

(75) Inventors: Young Do Hur, Chungcheongbuk-do (KR); Yeon Uk Kim, Incheon-si (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 133 days.

(21) Appl. No.: 12/207,598

(22) Filed: Sep. 10, 2008

(65) Prior Publication Data
US 2009/0262586 A1 Oct. 22, 2009

(30) Foreign Application Priority Data
Apr. 18, 2008 (KR) ...................... 10-2008-0036309

(51) Int. Cl.
*G11C 16/04* (2006.01)
(52) U.S. Cl. ............................ 365/189.07; 365/189.09; 365/230.06
(58) Field of Classification Search ............ 365/189.07, 365/189.09, 230.06, 63; 327/534–536
See application file for complete search history.

(56) References Cited

U.S. PATENT DOCUMENTS 5,835,420 A * 11/1998 Lee et al. ............... 365/189.09

FOREIGN PATENT DOCUMENTS

| KR | 1019970017591 A | 4/1997 |
| KR | 1020020084892 A | 11/2002 |

* cited by examiner

*Primary Examiner*—David Lam
(74) *Attorney, Agent, or Firm*—Ladas & Parry LLP

(57) ABSTRACT

A voltage generating circuit for semiconductor memory devices for use in avoiding the occurrence of leakage currents associated with parasitic diodes is presented. The circuit controls and stabilizes the generation of a feedback negative voltage to prevent parasitic diode malfunctions by a in a wordline driver. The voltage generating circuit includes a controller being fedback the negative voltage and detecting a potential difference between backbias voltage provided to a substrate of the cell and the negative voltage to generate a control signal. The voltage generating circuit also includes a voltage generator being fedback the negative voltage to detect a level thereof, and which subsequently generates and provides the negative voltage in response to the detected results of the negative voltage and the control signal.

24 Claims, 6 Drawing Sheets

SEMICONDUCTOR MEMORY DEVICE VOLTAGE GENERATING CIRCUIT FOR AVOIDING LEAKAGE CURRENTS OF PARASITIC DIODES

CROSS-REFERENCE TO RELATED APPLICATIONS

The present application claims priority to Korean patent application number 10-2008-0036309 filed on, Apr. 18, 2008 which is incorporated herein by reference in its entirety.

BACKGROUND OF THE INVENTION

The present invention generally relates to a semiconductor memory devices, and more particularly to a semiconductor memory device having a voltage generating circuit for precisely controlling the generation of negative voltages in order to prevent malfunctions associated with a parasitic diode in a wordline driver.

In semiconductor memory devices, especially, in DRAM devices which often times include huge numbers of memory cells for storing data, malfunctions are unwanted. Each memory cell includes a cell capacitor and a cell transistor controlling read/write operations of the inputted or outputted data. Accordingly, DRAM devices perform huge operations of data write, data read, and data refresh operations for the plurality of memory cell. Among others, the refresh operation is prone to be adversely affected by a leakage current. A large number of efforts have been undertaken to prevent or at least minimize the occurrence of the unwanted generation of the leakage currents from the cell.

The leakage currents can be classified into either a junction leakage current or a channel leakage current.

The junction leakage current is generated by defects at a junction boundary of the cell transistor. Channel leakage current is a leakage current flowing through a channel of the cell transistor.

The junction leakage current can be suppressed by reducing the ion concentration of the channel. However, the reduction in the ion concentration of the channel can result in increasing the channel leakage current. The channel leakage current can be reduced by increasing threshold voltage of the cell transistor. However this increase of the threshold voltage of the cell transistor can result in causing an increase in the junction leakage current.

In order to reduce such leakage currents, a negative wordline driving manner can be used to provide high voltage VPP when enabling a wordline, and to provide negative voltage VBBW lower than a ground level when disabling a wordline. As the negative voltage drops below than the ground level, there is voltage reversely biasing at the substrate. This voltage reversely biasing of the substrate is commonly referred to as backbias voltage VBB, in order to distinguish it from the negative voltage VBBW.

If such a negative wordline driving manner is used, refresh characteristics are improved and characteristics of other AC parameters are improved. In particular, a refresh time can be reduced, a VPP burden can be reduced when low level operation voltage Vcc is used, and a tWR (Write Recovery Time) can be improved so that the negative wordline driving manner has been widely used.

FIG. 1 is a block diagram of a voltage generating circuit generating negative voltage WBBW.

FIG. 1 shows a voltage generating circuit which includes a VBBW level detector 10, an oscillator 20, and a pumping unit 30.

The VBBW level detector 10 is shown having a fedback negative voltage VBBW for detecting the level thereof and outputting an oscillator enable signal OSCEN. The oscillator 20 is shown receiving the oscillator enable signal OSCEN to enable the oscillator 20 to generate a pulse signal OSC. The pumping unit 30 is shown having a capacitor and two diodes sharing a common node B in which the pumping unit 30 receives the pulse signal OSC to perform a charge pumping of the negative voltage.

The conventional negative voltage generating circuit generates regulated negative voltage using a negative feedback operation. When the negative voltage VBBW increases, the level detector 10 enables the oscillator enable signal OSCEN to enable the oscillator 20. As a result the negative voltage VBBW level is gradually reduced by the charge pumping until the oscillator 20 is disabled.

The VBBW level detector 10 can be configured as shown in FIG. 2. The VBBW level detector 10 of FIG. 2 includes PMOS transistors M1 and M2, and inverters INV1 and INV2. And, VNN means negative voltage VBBW to be fedback.

FIG. 2 shows that when the negative voltage VBBW increases, a source-drain equivalent resistance of the PMOS transistor M2 increases and as a result the voltage at node A rises. When the voltage at the node A reaches a trip point of the inverter, the output signal OSCEN rises to a high level to enable the oscillator 20 and the enabled oscillator 20 drives the pumping unit 30.

As shown in FIG. 3, the oscillator 30 includes inverters INV3, INV4, INV5, and INV6. The inverter INV6 can be implemented using a 3-phase inverter. The oscillator 20 can be implemented in any number of different configurations different from that of FIG. 3.

Referring back to FIG. 1, the pumping unit 30 can include a capacitor C and two diodes D1 and D2. When the pulse signal OSC output from the oscillator 20 is high, a node B is clamped into threshold voltage Vth higher than ground voltage by the diode D1, and the capacitor C is charged with positive voltage VDD. When the pulse signal OSC is low, the capacitor C supplies negative charges through the diode D2.

FIG. 4 shows a waveform diagram of the negative voltage VBBW generated as above. Referring to FIG. 4, it can be appreciated that the conventional negative voltage VBBW has a ripple having a relatively large height difference.

The negative voltage generated as above is biased into negative voltage of a wordline. The backbias voltage VBB provided to the wordline is generated in the same method to be biased into the word line.

FIG. 5 shows a general sub wordline driver transferring a signal of a main wordline MWLB to a sub wordline SWL connected to gates of a plurality of cells with sub wordline driving voltage FX and the negative voltage VBBW.

The sub wordline driver includes a sub wordline driving voltage unit and a negative voltage driver. By way of example, the sub wordline driver configured as a CMOS type. This sub wordline driver includes one PMOS transistor M3 and two NMOS transistors M4, M5, as shown in FIG. 5. The PMOS transistor M3 corresponds to the sub wordline driving voltage unit. The NMOS transistors M4, M5 correspond to the negative voltage driver. Herein, the number of the NMOS transistors corresponding to the negative voltage driver may be designed in a proper number considering drivability.

One terminal of the PMOS transistor M3 is connected to sub wordline driving voltage FX and the other terminal thereof is connected to a sub wordline SWL. The gate of PMOS transistor M3 is connected to an inverted main wordline MWLB.

One terminal of the NMOS transistor M4 is commonly connected to the sub wordline SWL and to one terminal of the PMOS transistor M3. The other terminal of the NMOS transistor M4 is biased with the negative voltage VBBW. The gate of the NMOS transistor M4 is connected to the inverted main wordline MWLB as in the PMOS transistor M3. One terminal of the NMOS transistor M5 is connected to the sub wordline SWL and the other terminal thereof is biased with the negative voltage VBBW. The gate of the NMOS transistor M5 is connected to the sub wordline driving voltage FX.

The backbias voltage VBB is applied as the substrate voltage of the NMOS transistors M4, M5.

In this configuration, parasitic diodes D3, D4 are formed between the substrate (P-type impurity) and the source (N-type impurity) of the NMOS transistors M4, M5. When the ripple of the backbias voltage VBB is applied to the substrate and the negative voltage VBBW is applied to the source is large, this voltage difference may result in being higher than the threshold voltage of the parasitic diodes. As a result when the parasitic diodes D3, D4 are turned on, undesired leakage current can occur which causes the semiconductor device to malfunction. Referring to FIG. 6, it can be appreciated that a potential difference between the backbias voltage VBB and the negative voltage VBBW may be equal to or greater than the Von.

Therefore, in order to prevent or at least minimize the occurrence of this type of malfunction encountered in the semiconductor devices, a stable backbias voltage having a small ripple is needed.

SUMMARY OF THE INVENTION

There is provided a voltage generating circuit for a semiconductor memory device controlling a difference between backbias voltage and negative voltage to be below a predetermined level.

Also, there is provided a voltage generating circuit of a semiconductor memory device for preventing a turn on of an underlying parasitic diode in a sub wordline driver.

A voltage generating circuit for a semiconductor memory device generating negative voltage, according to the present invention, the voltage generating circuit includes: a controller being fedback the negative voltage provided to a wordline connected to a cell and detecting a potential difference between backbias voltage provided to a substrate of the cell and the negative voltage to generate a control signal; and a voltage generator being fedback the negative voltage to detect a level thereof, and generating and providing the negative voltage in response to the detected results of the negative voltage and the control signal.

A voltage generating circuit for a semiconductor memory device according to the present invention, includes: a sub wordline driver including a sub wordline driver driving sub wordline driving voltage and a negative voltage driver driving negative voltage, the negative voltage driver using backbias voltage as substrate voltage and transferring a signal in a main wordline to a sub wordline; a controller being fedback the negative voltage and detecting a potential difference between the backbias voltage and the fedback negative voltage to generate a control signal; and a voltage generator being fedback the negative voltage to detect a level thereof, and generating and providing the negative voltage in response to the detected results of the negative voltage and the control signal.

The voltage generator may include: a level detector detecting a level of the fedback negative voltage to output a pulse driving signal; an oscillator generating a pulse signal in response to the pulse driving signal and the control signal; and a pumping unit generating and providing the negative voltage by performing a pumping by the pulse signal.

The oscillator may include: a pulse generating controller receiving the pulse driving signal and the control signal to control pulse generation; and a pulse generator generating a pulse signal in response to an output signal of the pulse generating controller.

Herein, the pulse generating controller preferably outputs a signal having a fixed level when the control signal is enabled, and the pulse generator is preferably disenabled when the control signal is enabled.

The controller may includes: a control signal generator receiving the backbias voltage and the fedback negative voltage to generate the control signal determining an enable state according to a potential difference between the two voltages; a synchronizer allowing a level of the fedback negative voltage provided to the control signal generator when the control signal is enabled to be the same as that of the backbias voltage.

Herein, the control signal generator may include: a reference voltage generator generating reference voltage through a voltage distribution between power voltage and the backbias voltage; a comparison voltage generator generating comparison voltage through a voltage distribution between the power voltage and the fedback backbias voltage; and a comparator comparing the reference voltage with the comparison voltage to output the control signal.

Herein, the reference voltage generator may include a plurality of resistant elements connected in series, and the comparison voltage generator may include a plurality of MOS diodes connected in series. And, the comparator may enable the control signal when the comparison voltage is lower than the reference voltage, and may generate the control signal by amplifying the reference voltage and the comparison voltage using a current mirror amplifier circuit.

And, the synchronizer may include a switch element having both ends being applied with the fedback negative voltage and the backbias voltage and being switched by the control signal.

The present invention can generate stable negative voltage having a small fluctuation. Therefore, a voltage difference with backbias voltage can be maintained below turn on voltage.

Also, the present invention can prevent a turn on of a parasitic diode of a sub wordline driver in a semiconductor memory device.

DESCRIPTION OF SPECIFIC EMBODIMENTS

The present invention describes a semiconductor memory device capable of providing a more stable negative voltage by reducing a potential level difference between the negative voltage and backbias voltage, thereby preventing or at least minimizing the occurrence of an unwanted turn on event of a parasitic diode.

Figure 1:
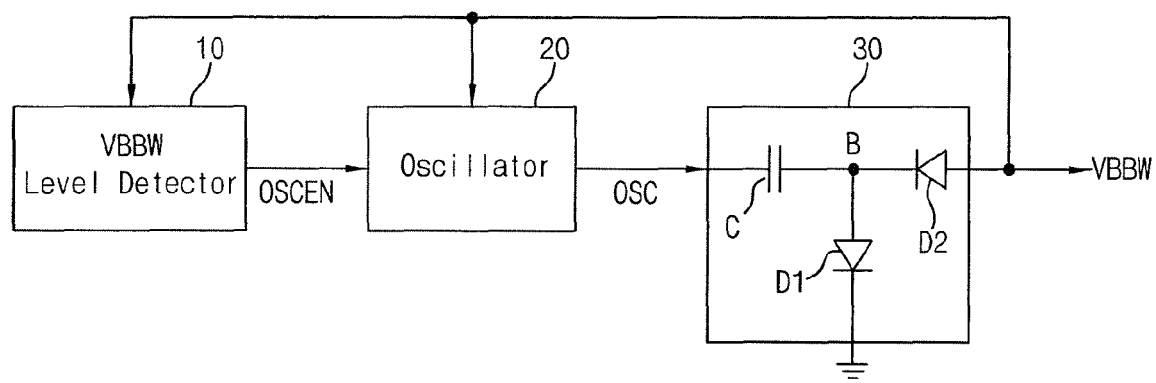
FIG. 1 is a block diagram of a voltage generating circuit according to the prior art.
Figure 2:
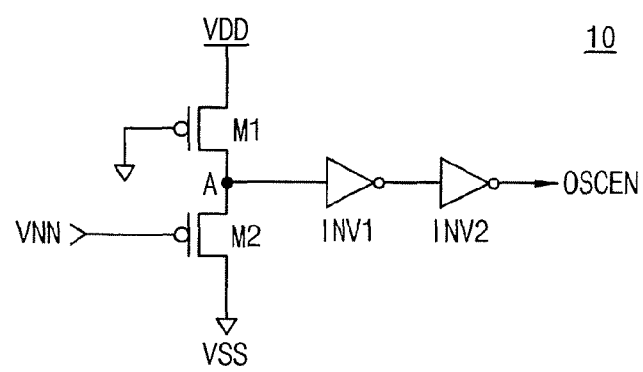
FIG. 2 is a detailed circuit diagram of a voltage level detector 10 of FIG. 1.
Figure 3:
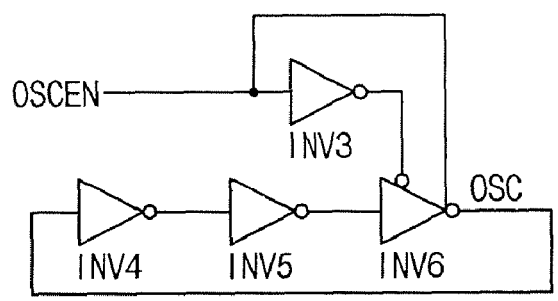
FIG. 3 is a detailed circuit diagram of the oscillator 20 of FIG. 1
Figure 4:
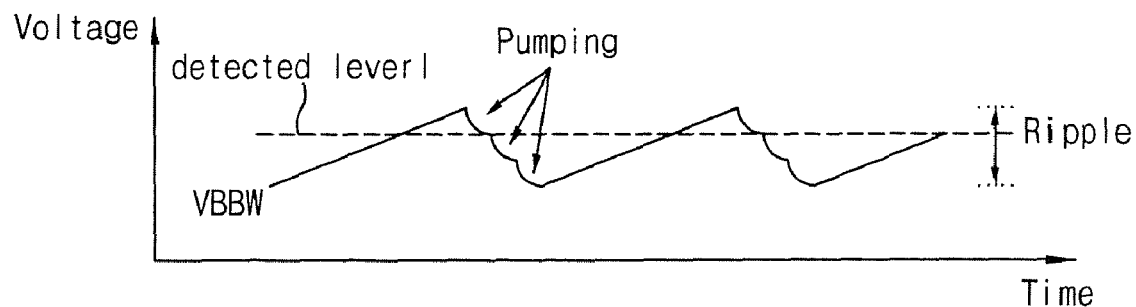
FIG. 4 is a waveform diagram of a fluctuation range of negative voltage according to the prior art.
Figure 5:
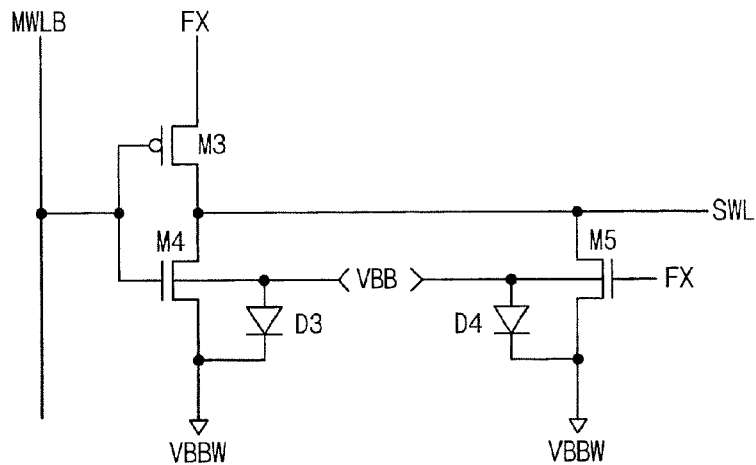
FIG. 5 is a circuit diagram of a sub wordline driver of a semiconductor memory device.
Figure 6:
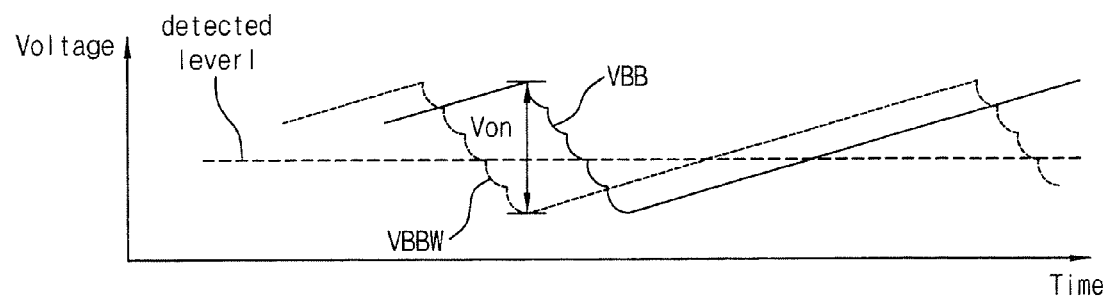
FIG. 6 is a waveform diagram of backbias voltage and negative voltage.
Figure 7:
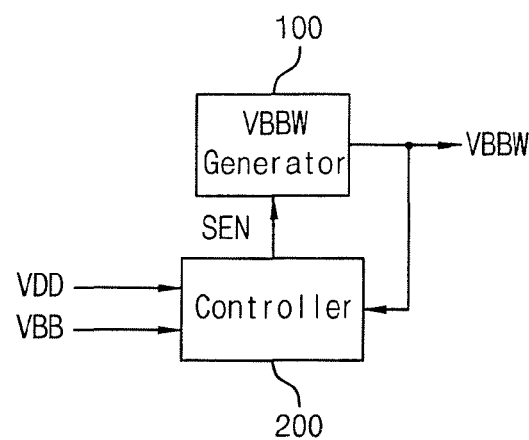
FIG. 7 is a block diagram of a voltage generating circuit according to the present invention.

FIG. 7 is a block diagram of a voltage generating circuit of a semiconductor memory device according to the present invention.

FIG. 7 shows a voltage generating circuit includes a VBBW generator 100 being fedback negative voltage VBBW output and generating the negative voltage VBBW in response to a control signal SEN. Also shown is a controller 200 receiving a power voltage VDD, a backbias voltage VBB, and the negative voltage VBBW in which the controller 200 provides the control signal SEN to the VBBW generator 100, also referred to as the negative voltage generator 100.

Figure 8:
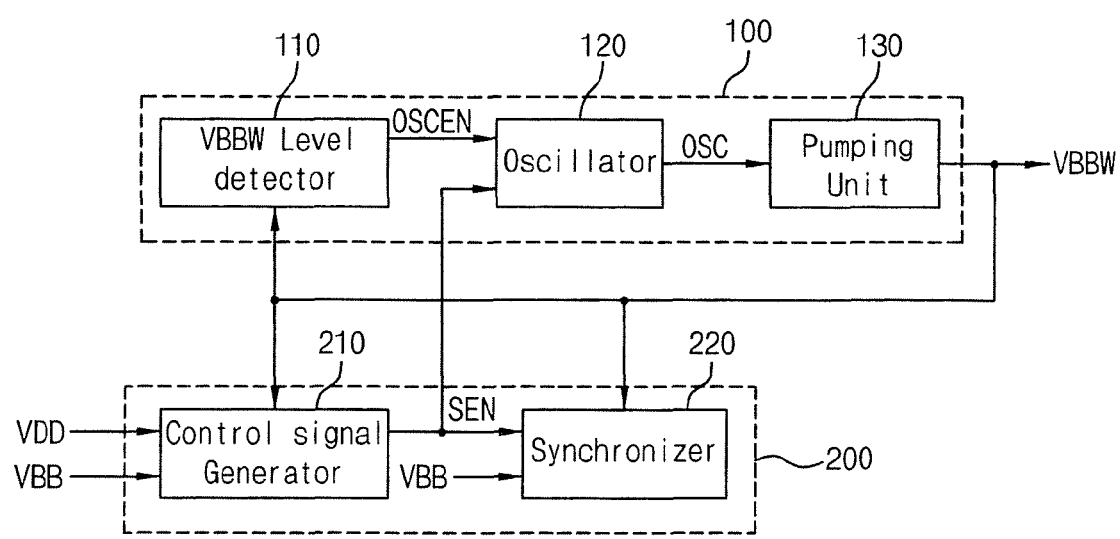
FIG. 8 is a detailed block diagram of FIG. 7.

FIG. 8 shows one embodiment of the voltage generating circuit of the semiconductor memory device having a constitution of FIG. 7, using a detailed block diagram.

FIG. 8 shows the negative voltage generator 100 comprising VBBW level detector 110, an oscillator 120 and a pumping unit 130. The VBBW level detector 110 is shown detecting a level of the feedback negative voltage VBBW to output an oscillator driving signal OSCEN to the oscillator 120. The oscillator 120 is shown receiving a control signal SEN output from a control signal generator 210 of a the controller 200 and receiving the oscillator driving signal OSCEN from the VBBW level detector. The oscillator 120 is shown generating a pulse signal OSC having a predetermined period. The pumping unit 130 is shown receiving the pulse signal OSC to pump the negative voltage VBBW.

As a result of this configuration, the negative voltage generator 100 detects a potential level of the feedback negative voltage VBBW, generates the pulse signal OSC in response to the detected results of the fedback negative voltage VBBW and in response to the control signal SEN. The negative voltage generator 100 then pumps or drives the negative voltage VBBW which corresponds to a state of the pulse signal OSC.

The controller 200 includes a control signal generator 210 driven by the backbias voltage VBB and by the power voltage VDD which detects a level of the negative voltage VBBW to generate the control signal SEN. The controller 200 also includes a synchronizer 220 synchronizing the negative voltage VBBW turned on when the control signal SEN is enabled to be provided to the control signal generator 210 with the backbias voltage VBB.

If the negative voltage VBBW falls below a predetermined level and the control signal SEN is enabled to allow the oscillator 120 to be disabled, then the pulse signal OSC is fixed at either a high level or a low level which results in the pumping unit 130 not performing a pumping operation. And, as a result of the control signal SEN being enabled, the negative voltage VBBW rises up to a level substantially matching that of the backbias voltage VBB. In other words, the controller 200 receives the negative voltage VBBW and receives the backbias voltage VBB and subsequently compares these values thereof to control the generation of the pulse signal OSC in response to this compared result.

Figure 9:
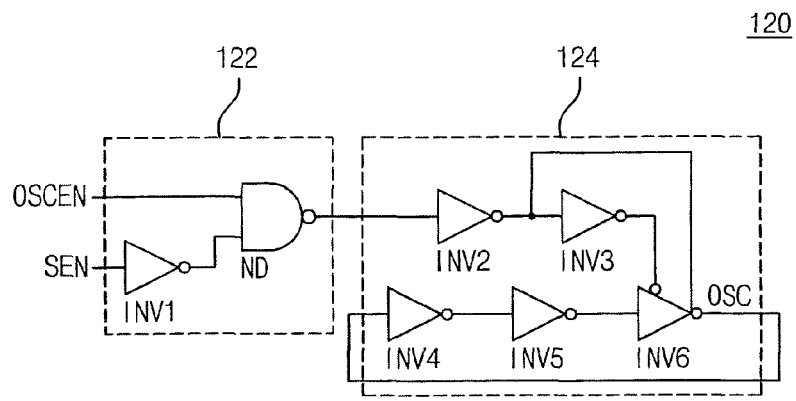
FIG. 9 is a detailed circuit diagram of the oscillator 120 of FIG. 8.

FIG. 9 shows the oscillator 120 includes a pulse generating controller 122 and a pulse signal generator 124. The pulse generating controller 122 combines the oscillator driving signal OSCEN and a control signal SEN to control pulse generation. The pulse signal generator 124 generates a pulse signal OSC according to an output signal of the pulse generating controller 122.

The pulse generating controller 122 includes an inverter INV1 inverting a phase of the control signal SEN and a NAND gate ND receiving the oscillator driving signal OSCEN and an output signal of the inverter INV1. Accordingly when the control signal SEN is enabled, an output of the NAND gate ND is fixed to a high level.

The pulse signal generator 124 includes a plurality of inverters INV2 to INV6. The signals inverted through the inverters INV2, INV3 each are input as a control signal of a 3-phase inverter INV6 and the output signal OSC of the 3-phase inverter INV6 is fedback to be input to the inverter INV4.

Figure 10:
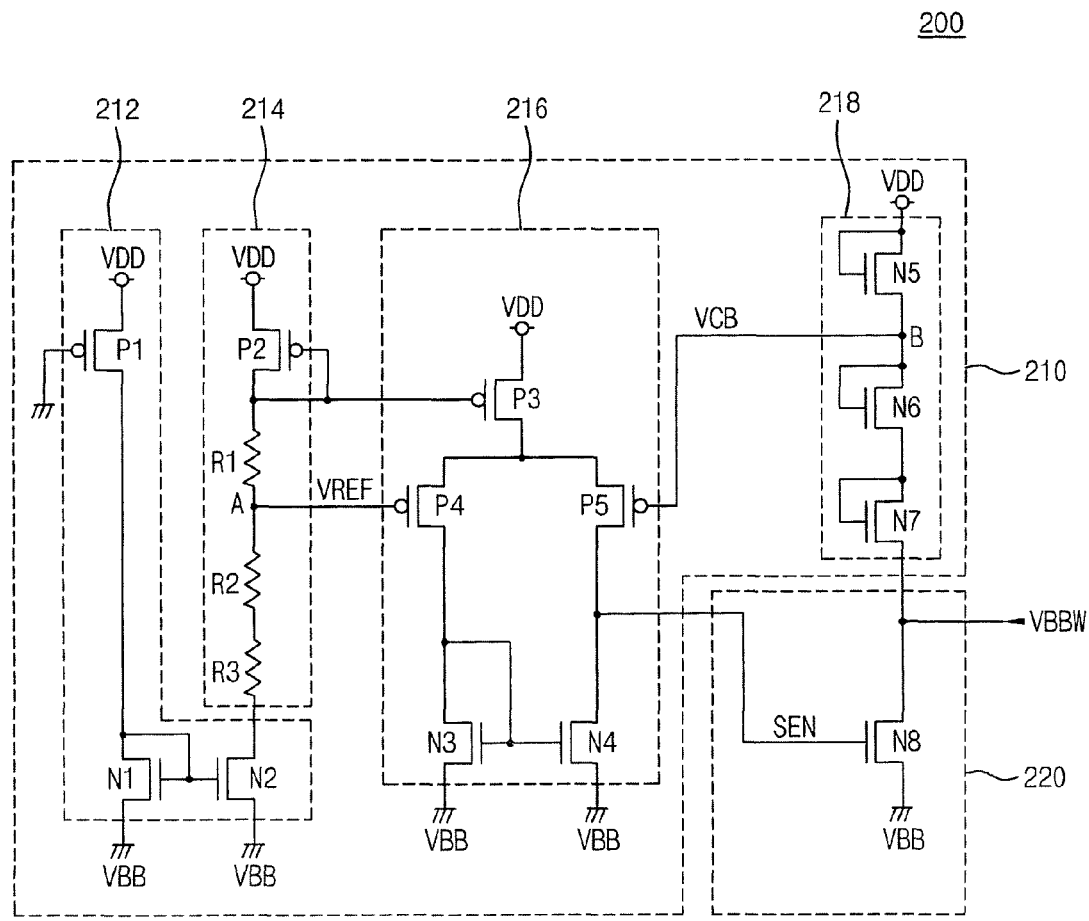
FIG. 10 is a detailed circuit diagram of the controller 200 of FIG. 7.

FIG. 10 shows the controller 200 includes the control signal generator 210 and the synchronizer 220. The control signal generator 210 includes a current mirror unit 212, a reference voltage generator 214, a comparator 216, and comparison voltage generator 218. The reference voltage generator 214 generates reference voltage VREF through a voltage distribution between the backbias voltage VBB and the power voltage VDD. The comparison voltage generator 218 is applied with the power voltage VDD to generate a comparison voltage VCB through a voltage distribution between the negative voltage VBBW and the power voltage VDD. The comparator 216 compares the reference voltage VREF and the comparison voltage VCB to output a control signal SEN to the synchronizer 220. The current mirror unit 212 control the current of the reference voltage generator 214. Preferably, the reference voltage VREF is set to be a middle value of a voltage fluctuation.

The current mirror unit 212 includes a PMOS transistor P1 whose gate is connected to the backbias voltage VBB and whose one terminal is connected to the power voltage VDD and NMOS transistors N1, N2 formed in a mirror structure. As a result of the configuration of the current mirror unit 212, a relatively constant supply of current can be provided at the power voltage VDD even though the potential levels may fluxuate by instantly rising or falling due to various external factors. Accordingly, this configuration makes it possible to maintain a relatively constant level of the reference voltage VREF.

The reference voltage generator 214 includes a PMOS diode P2 having one terminal is connected to the power voltage VDD. The reference voltage generator 214 also includes a plurality of resistance elements R1, R2, R3.

The comparator 216 includes a plurality of PMOS transistors P3, P4, P5 and NMOS transistors R1, R2, R3 in a mirror structure.

The comparison voltage generator 218 includes NMOS diodes N5, N6, N7 connected in series having a pickoff node B for the comparison voltage VCB.

The synchronizer 220 includes an NMOS transistor N8 turned on when the control signal SEN is enabled. When the NMOS transistor N8 is turned on by applying the backbias voltage VBB to a source of the NMOS transistor N8 and forming an output terminal on a drain side thereof, the backbias voltage VBB is output to the negative voltage VBBW. Preferably, the NMOS transistor N8 uses an analog type. That is as the transistor N8 is turned on, the backbias voltage VBB is not immediately output to the negative voltage VBBW but it gradually rises up to a level of the backbias voltage.

An operation of the circuit will be described as follows.

If the negative voltage VBBW is fedback to be input to the control signal generator 210 and to the synchronizer 220, the reference voltage VREF is output from a node A of the reference voltage generator 214 and the comparison voltage VCB is output from a node B of the comparison voltage generator 218. When a voltage level of the comparison voltage VCB is lower than that of the reference voltage VREF, the control signal SEN is enabled and the NMOS transistor N9 is turned on so that the negative voltage VBBW rises up to the level vicinity of the backbias voltage VBB. If the negative voltage VBBW rises up to a predetermined level, the comparison voltage VCB of the node B also rises so that the control signal SEN is disabled and the NMOS transistor N8 is turned off.

At this time, as the control signal SEN is enabled, an output of the NAND gate ND of the oscillator 120 is fixed at a high level and a 3-phase inverter INV6 is disabled so that the output signal OSC of the 3-phase inverter is fixed at either a high level or a low level.

As a result of this configuration when the negative voltage VBBW falls below a predetermined level, the control signal SEN is enabled so that a pulse signal is not generated in the oscillator 120 and a level of the VBBW rises. In the event that the level of the negative voltage VBBW rises, the control signal SEN is disabled again and the oscillator 120 and the pumping unit 130 perform a normal operation so that the negative voltage VBBW is output.

With the operation as above, the present invention can prevent of at least minimize the occurrence of the negative voltage VBBW from falling below a predetermined level.

Figure 11:
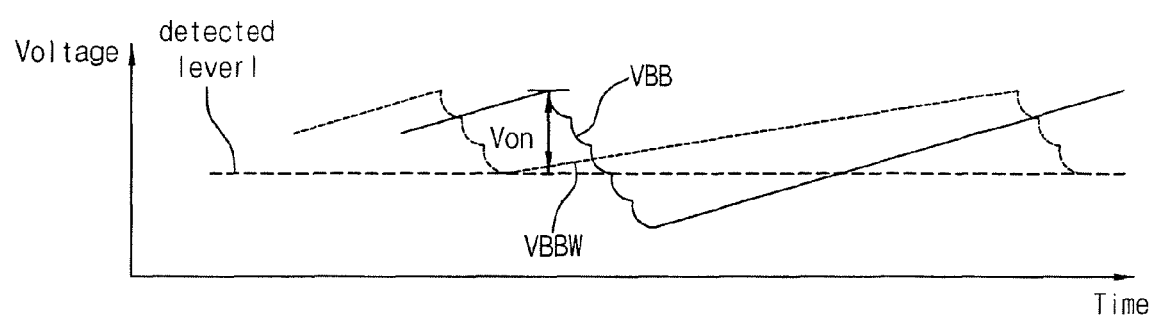
FIG. 11 is a graph showing a fluctuation range of negative voltage VBBW and backbias voltage VBB according to the present invention.

Referring to FIG. 11, it can be appreciated that the negative voltage VBBW is raised and then falls relative to a detecting level, and is then raised again relative to the detecting level.

With a voltage generating device as above, the present invention can generate a relatively stable negative voltage VBBW having a relatively minor fluctuation to reduce a potential difference between the negative voltage VBBW and backbias voltage VBB. Accordingly, the present invention makes it possible to prevent or at least significantly minimize the undesired occurrences that the parasitic diode will result on being turned on.

Those skilled in the art will appreciate that the specific embodiments disclosed in the foregoing description may be readily utilized as a basis for modifying or designing other embodiments for carrying out the same purposes of the present invention. Those skilled in the art will also appreciate that such equivalent embodiments do not depart from the spirit and scope of the invention as set forth in the appended claims.

What is claimed is:

1. A voltage generating circuit for a semiconductor memory device comprising:
   a controller being fedback a negative voltage provided to a wordline connected to a cell in the semiconductor memory device and generating a control signal in response to a potential difference between a backbias voltage provided to a substrate of the cell and the negative voltage; and
   a voltage generator being fedback the negative voltage to detect a level of the negative voltage, and generating and providing the negative voltage in response to the detected level of the negative voltage and in response to the control signal.

2. The voltage generating circuit as set forth in claim 1, wherein the voltage generator includes: a level detector detecting the level of the fedback negative voltage and outputting a pulse driving signal; an oscillator generating a pulse signal in response to the pulse driving signal and in response to the control signal; and a pumping unit generating and providing the negative voltage by performing a pumping in response to the pulse signal.

3. The voltage generating circuit as set forth in claim 2, wherein the oscillator includes: a pulse generating controller receiving the pulse driving signal and the control signal to control pulse generation; and a pulse generator generating the pulse signal in response to an output signal of the pulse generating controller.

4. The voltage generating circuit as set forth in claim 3, wherein the pulse generating controller outputs a signal having a substantially fixed voltage level when the control signal is enabled.

5. The voltage generating circuit as set forth in claim 3, wherein the pulse generator is disenabled when the control signal is enabled.

6. The voltage generating circuit as set forth in claim 1, wherein the controller includes: a control signal generator receiving the backbias voltage and the fedback negative voltage to generate the control signal determining an enable state in response to a potential difference between the backbias and fedback negative voltages; a synchronizer allowing a level of the fedback negative voltage provided to the control signal generator to be substantially the same as that of the backbias voltage when the control signal is enabled.

7. The voltage generating circuit as set forth in claim 6, wherein the control signal generator includes: a reference voltage generator generating a reference voltage through a first voltage distribution between a power voltage and the backbias voltage; a comparison voltage generator generating a comparison voltage through a second voltage distribution between the power voltage and the fedback backbias voltage; and a comparator comparing the reference voltage with the comparison voltage to output the control signal.

8. The voltage generating circuit as set forth in claim 7, wherein the first voltage distribution of the reference voltage generator includes a plurality of resistant elements connected in series.

9. The voltage generating circuit as set forth in claim 7, wherein the second voltage distribution of the comparison voltage generator includes a plurality of MOS diodes connected in series.

10. The voltage generating circuit as set forth in claim 7, wherein the comparator enables the control signal when the comparison voltage is lower than the reference voltage.

11. The voltage generating circuit as set forth in claim 7, wherein the comparator generates the control signal by amplifying the reference voltage and the comparison voltage using a current mirror amplifier circuit.

12. The voltage generating circuit as set forth in claim 6, wherein the synchronizer includes a switch element having one end being applied with the fedback negative voltage, another end being applied with the backbias voltage and being switched by the control signal.

13. A voltage generating circuit for a semiconductor memory device, comprising:
   a sub wordline driver including a sub wordline driver driving sub wordline driving voltage and a negative voltage driver driving negative voltage, the negative voltage driver using a backbias voltage as a substrate voltage and transferring a signal in a main wordline to a sub wordline;

a controller being fedback the negative voltage and detecting a potential difference between the backbias voltage and the fedback negative voltage to generate a control signal; and a voltage generator being fedback the negative voltage to detect a level of the negative voltage, and generating and providing the negative voltage in response to the detected results of the negative voltage and the control signal.

14. The voltage generating circuit as set forth in claim 13, wherein the voltage generator includes: a level detector detecting a level of the fedback negative voltage to output a pulse driving signal; an oscillator generating a pulse signal in response to the pulse driving signal and the control signal; and a pumping unit generating and providing the negative voltage by performing a pumping in response to the pulse signal.

15. The voltage generating circuit as set forth in claim 14, wherein the oscillator includes: a pulse generating controller receiving the pulse driving signal and receiving the control signal to control pulse generation; and a pulse generator generating a pulse signal in response to an output signal of the pulse generating controller.

16. The voltage generating circuit as set forth in claim 15, wherein the pulse generating controller outputs a signal having a substantially fixed voltage level when the control signal is enabled.

17. The voltage generating circuit as set forth in claim 15, wherein the pulse generator is disenabled when the control signal is enabled.

18. The voltage generating circuit as set forth in claim 13, wherein the controller includes: a control signal generator receiving the backbias voltage and the fedback negative voltage to generate the control signal for determining an enable state according to a potential difference between the backbias and negative voltages; a synchronizer allowing a level of the fedback negative voltage provided to the control signal generator to be the same as that of the backbias voltage when the control signal is enabled.

19. The voltage generating circuit as set forth in claim 18, wherein the control signal generator includes: a reference voltage generator generating a reference voltage through a first voltage distribution between a power voltage and the backbias voltage; a comparison voltage generator generating a comparison voltage through a second voltage distribution between the power voltage and the fedback backbias voltage; and a comparator comparing the reference voltage with the comparison voltage to output the control signal.

20. The voltage generating circuit as set forth in claim 19, wherein the first voltage distribution of the reference voltage generator includes a plurality of resistant elements connected in series.

21. The voltage generating circuit as set forth in claim 19, wherein the second voltage distribution of the comparison voltage generator includes a plurality of MOS diodes connected in series.

22. The voltage generating circuit as set forth in claim 19, wherein the comparator enables the control signal when the comparison voltage is lower than the reference voltage.

23. The voltage generating circuit as set forth in claim 19, wherein the comparator generates the control signal by amplifying the reference voltage and the comparison voltage using a current mirror amplifier circuit.

24. The voltage generating circuit as set forth in claim 18, wherein the synchronizer includes a switch element having one end being applied with the fedback negative voltage, another end being applied with the backbias voltage and being switched by the control signal.

\* \* \* \* \*